US010560651B2

(12) United States Patent
Nishida

(10) Patent No.: US 10,560,651 B2
(45) Date of Patent: Feb. 11, 2020

(54) IMAGING ELEMENT, IMAGING METHOD, AND ELECTRONIC EQUIPMENT

(71) Applicant: SONY SEMICONDUCTOR SOLUTIONS CORPORATION, Kanagawa (JP)

(72) Inventor: Yuusuke Nishida, Fukuoka (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/773,693

(22) PCT Filed: Oct. 31, 2016

(86) PCT No.: PCT/JP2016/082214
§ 371 (c)(1),
(2) Date: May 4, 2018

(87) PCT Pub. No.: WO2017/082090
PCT Pub. Date: May 18, 2017

(65) Prior Publication Data
US 2018/0332248 A1  Nov. 15, 2018

(30) Foreign Application Priority Data
Nov. 12, 2015 (JP) ................................. 2015-221733

(51) Int. Cl.
*H04N 5/374* (2011.01)
*H01L 27/146* (2006.01)
(Continued)

(52) U.S. Cl.
CPC ..... *H04N 5/3745* (2013.01); *H01L 27/14609* (2013.01); *H04N 5/378* (2013.01)

(58) Field of Classification Search
None
See application file for complete search history.

(56) References Cited

U.S. PATENT DOCUMENTS

2009/0309991 A1  12/2009 Lim et al.
2010/0171853 A1   7/2010 Kon Do
(Continued)

FOREIGN PATENT DOCUMENTS

JP  2005-303648  10/2005
JP  2009-296423  12/2009
(Continued)

OTHER PUBLICATIONS

Extended European Search Report for European Patent Application No. 16864053.0, dated Aug. 13, 2018, 8 pages.
(Continued)

*Primary Examiner* — Mark T Monk
(74) *Attorney, Agent, or Firm* — Sheridan Ross P.C.

(57) ABSTRACT

The present technology relates to an imaging element, an imaging method, and a piece of electronic equipment that permit faster processing. A column AD signal processing section and a ramp signal generation section are provided. The column AD signal processing section has, for each pixel column, an AD conversion section. The plurality of pixels arranged in the same column are connected to the AD conversion section via a vertical signal line. In parallel with reset operation or signal transfer operation, the pixel signals output from the pixels connected via other vertical signal lines are converted from analog to digital form by the AD conversion section. The ramp signal is supplied to the AD conversion sections that perform AD conversion of the pixel signals and is not supplied to the AD conversion sections that do not perform AD conversion. The present technology is applicable, for example, to CMOS image sensors.

7 Claims, 11 Drawing Sheets

(51) Int. Cl.
*H04N 5/3745* (2011.01)
*H04N 5/378* (2011.01)

(56) References Cited

U.S. PATENT DOCUMENTS

| | | |
|---|---|---|
| 2010/0231768 A1 | 9/2010 | Utsunomiya et al. |
| 2013/0256511 A1 | 10/2013 | Kim |
| 2014/0362271 A1 | 12/2014 | Kanagawa |
| 2015/0146063 A1 | 5/2015 | Nishizawa |

FOREIGN PATENT DOCUMENTS

| | | |
|---|---|---|
| JP | 2010-161484 | 7/2010 |
| JP | 2014-239289 | 12/2014 |
| JP | 2015-104021 | 6/2015 |

OTHER PUBLICATIONS

International Search Report prepared by the Japan Patent Office dated Dec. 1, 2016, for International Application No. PCT/JP2016/082214.

IMAGING ELEMENT, IMAGING METHOD, AND ELECTRONIC EQUIPMENT

CROSS REFERENCE TO RELATED APPLICATIONS

This application is a national stage application under 35 U.S.C. 371 and claims the benefit of PCT Application No. PCT/JP2016/082214 having an international filing date of 31 Oct. 2016, which designated the United States, which PCT application claimed the benefit of Japanese Patent Application No. 2015-221733 filed 12 Nov. 2015, the entire disclosures of each of which are incorporated herein by reference.

TECHNICAL FIELD

The present technology relates to an imaging element, an imaging method, and a piece of electronic equipment, and more particularly, to an imaging element, an imaging method, and a piece of electronic equipment that achieve more speedup.

BACKGROUND ART

In the past, imaging elements such as CCD (Charge Coupled Device) and CMOS (Complementary Metal Oxide Semiconductor) image sensors have been used in electronic equipment having an imaging function such as digital still camera and digital video camera.

An imaging element has pixels that include PDs (photodiodes) that convert light into an electric current and a plurality of transistors, creating an image on the basis of pixel signals output from a plurality of pixels that are arranged in a planar manner. Also, the pixel signals output from the pixels are, for example, converted from analog into digital form and output by a plurality of AD (Analog to Digital) converters that are arranged for each column of pixels in parallel.

In such an imaging element, an imaging element has been proposed that handles an AD conversion process faster by performing a counting process in down-count and up-count modes (refer, for example, to PTL 1).

Also, an imaging element has been proposed that can reduce noise by performing AD conversion of pixel signals at reset level and pixel signals at signal level (refer, for example, to PTL 2).

CITATION LIST

Patent Literature

[PTL 1]
  JP 2005-303648A
[PTL 2]
  JP 2009-296423A

SUMMARY

Technical Problem

Incidentally, there is a strong request for fast readout of pixel signals to an imaging element. It is possible to achieve speedup by increasing the number of column parallel AD converters as described above.

However, individual AD converters have their capacitances. There has been a possibility that as the AD converters increase in number, error is more likely to occur as a result of increase in total capacitance value of the column parallel AD converters that are arranged in parallel. That is, in the case of signal readout by a CDS method, the reset level is determined at concentrated timings in all the AD converters, and the signal level is determined at varying timings. There has been a possibility that error may occur in the CDS value because of this difference.

The present technology has been devised in light of the above circumstances, and it is an object of the present technology to achieve more speedup and, at the same time, keep occurrences of errors to a minimum.

Solution to Problem

An imaging element of an aspect of the present technology includes a pixel area, a column AD signal processing section, and a ramp signal generation section. The pixel area has a plurality of pixels arranged in a matrix form. The column AD signal processing section has, for each pixel column, an AD conversion section for converting pixel signals output from the pixels from analog into digital form (performing AD (Analog to Digital) conversion). The plurality of pixels arranged in the same column are connected to the AD conversion section via a vertical signal line. The ramp signal generation section generates a ramp signal. The AD conversion section performs an operation of converting, in parallel with reset operation or signal transfer operation performed by the pixels connected via some of a given number of vertical signal lines, the pixel signals output from the pixels connected via other vertical signal lines from analog to digital form. These operations are carried out alternately and repeatedly. The ramp signal is controlled in such a manner as to be supplied to the AD conversion sections that perform AD conversion of the pixel signals output from the pixels and not supplied to the AD conversion sections that do not perform AD conversion.

The control can be achieved by controlling opening and closing of a switch, and the switch can be provided on a path between the ramp signal generation section and the AD conversion section.

The control can be achieved by controlling opening and closing of a switch, and the switch can be provided inside a comparator included in the AD conversion section.

The switch can be provided on a current path inside the comparator.

The switch can be provided on a current path on one of two sides inside the comparator, the side where a signal from the pixel is processed and the side where a ramp signal from the ramp signal generation section is processed.

The ramp signal generation section can generate ramp signals individually for reading out a pixel signal of a first pixel at reset level, a pixel signal of a second pixel at reset level, a pixel signal of the first pixel at signal level, and a pixel signal of the second pixel at signal level repeatedly in this order, and the control can be achieved by controlling opening and closing of a switch, and the switch can be switched from an open state to a closed state or vice versa when the ramp signals are switched from one to another.

An imaging method of an aspect of the present technology is an imaging method of an imaging element that includes a pixel area, a column AD signal processing section, and a ramp signal generation section. The pixel area has a plurality of pixels arranged in a matrix form. The column AD signal processing section has, for each pixel column, an AD conversion section for converting pixel signals output from the pixels from analog into digital form (performing AD (Analog to Digital) conversion). The plurality of pixels arranged in the same column are connected to the AD conversion section via a vertical signal line. The ramp signal generation section generates a ramp signal. The imaging method includes a step in which the AD conversion section performs an operation of converting, in parallel with reset operation or signal transfer operation performed by the pixels connected via some of a given number of vertical signal lines, the pixel signals output from the pixels connected via other vertical signal lines from analog to digital form. These operations are carried out alternately and repeatedly. The imaging method includes a step in which the ramp signal is controlled in such a manner as to be supplied to the AD conversion sections that perform AD conversion of the pixel signals output from the pixels and not supplied to the AD conversion sections that do not perform AD conversion.

A piece of electronic equipment of an aspect of the present technology includes an imaging element that includes a pixel area, a column AD signal processing section, and a ramp signal generation section. The pixel area has a plurality of pixels arranged in a matrix form. The column AD signal processing section has, for each pixel column, an AD conversion section for converting pixel signals output from the pixels from analog into digital form (performing AD (Analog to Digital) conversion). The plurality of pixels arranged in the same column are connected to the AD conversion section via a vertical signal line. The ramp signal generation section generates a ramp signal. The AD conversion section performs an operation of converting, in parallel with reset operation or signal transfer operation performed by the pixels connected via some of a given number of vertical signal lines, the pixel signals output from the pixels connected via other vertical signal lines from analog to digital form. These operations are carried out alternately and repeatedly. The ramp signal is controlled in such a manner as to be supplied to the AD conversion sections that perform AD conversion of the pixel signals output from the pixels and not supplied to the AD conversion sections that do not perform AD conversion.

In the imaging apparatus and the imaging method of an aspect of the present technology, a pixel area, a column AD signal processing section, and a ramp signal generation section are provided. The pixel area has a plurality of pixels arranged in a matrix form. The column AD signal processing section has, for each pixel column, an AD conversion section for converting pixel signals output from the pixels from analog into digital form (performing AD (Analog to Digital) conversion). The plurality of pixels arranged in the same column are connected to the AD conversion section via a vertical signal line. The ramp signal generation section generates a ramp signal. The AD conversion section performs an operation of converting, in parallel with reset operation or signal transfer operation performed by the pixels connected via some of a given number of vertical signal lines, the pixel signals output from the pixels connected via other vertical signal lines from analog to digital form. These operations are carried out alternately and repeatedly. The ramp signal is controlled in such a manner as to be supplied to the AD conversion sections that perform AD conversion of the pixel signals output from the pixels and not supplied to the AD conversion sections that do not perform AD conversion.

The piece of electronic equipment includes the imaging apparatus.

Advantageous Effect of Invention

According to an aspect of the present invention, it is possible to achieve more speedup and, at the same time, keep occurrences of errors to a minimum.

It should be noted that the effect described herein is not necessarily limited and may be any one of the effects described in the present disclosure.

DESCRIPTION OF EMBODIMENTS

A description will be given below of modes for carrying out the present technology (hereinafter referred to as an embodiment). It should be noted that the description will be given in the following order:

1. Configuration of the Imaging Element
2. Configurations of the Pixel and the Column Processing Section
3. Other Configurations of the Pixel and the Column Processing Section
4. AD Conversion Operation
5. Ramp Signal
6. Positions of the Switches for Controlling Supply of a Ramp Signal
7. Configurations of the Comparator and the Switch
8. Example of Application to a Piece of Electronic Equipment
9. Usage Example <Configuration of the Imaging Element>

Figure 1:
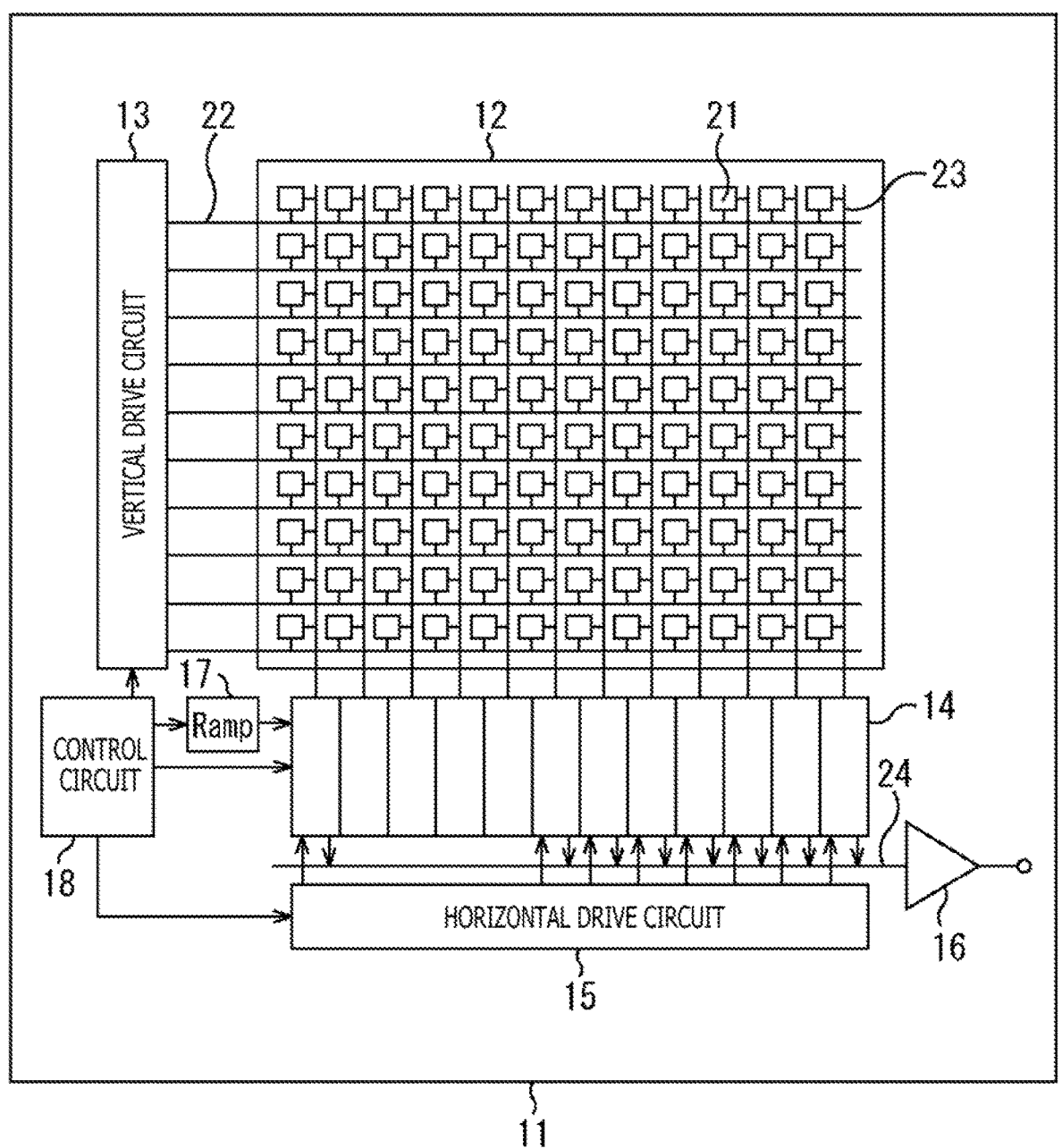
FIG. 1 is a diagram illustrating a configuration of an embodiment of an imaging element to which the present technology is applied.

FIG. 1 is a diagram illustrating a configuration of an embodiment of an imaging element to which the present technology is applied.

As illustrated in FIG. 1, an imaging element 11 includes a pixel area 12, a vertical drive circuit 13, a column signal processing circuit 14, a horizontal drive circuit 15, an output circuit 16, a ramp signal generation circuit 17, and a control circuit 18.

The pixel area 12 is a light-receiving surface that receives light collected by optics that is not illustrated. The pixel area 12 has a plurality of pixels 21 arranged in a matrix form. Each of the pixels 21 is connected, row-by-row, to the vertical drive circuit 13 via a horizontal signal line 22 and is connected, column-by-column, to the column signal processing circuit 14 via a vertical signal line 23. Each of the plurality of pixels 21 outputs a pixel signal whose level is proportional to the amount of light received, creating a subject image formed on the pixel area 12 from these pixel signals.

The vertical drive circuit 13 supplies, to the pixel 21 via the horizontal signal line 22, drive signals for driving the respective pixels 21 (e.g., for transfer, selection, reset) successively row-by-row of the plurality of pixels 21 arranged in the pixel area 12.

The column signal processing circuit 14 subjects the pixel signals output from the plurality of pixels 21 via the vertical signal lines 23 to a CDS (Correlated Double Sampling) process, thereby converting the pixel signals from analog into digital form and removing reset noise. For example, the column signal processing circuit 14 includes a plurality of column processing sections 41 (refer to FIG. 2 which will be described later) the number of which matches the number of columns of the pixels 21, allowing the CDS process to be carried out for each column of the pixels 21 in parallel.

The horizontal drive circuit 15 supplies, to the column signal processing circuit 14, a drive signal for causing a pixel signal to be output from the column signal processing circuit 14 to a data output signal line 24, successively for each of the columns of the plurality of pixels 21 arranged in the pixel area 12.

The output circuit 16 amplifies the pixel signal, supplied from the column signal processing circuit 14 via the data output signal line 24, at a timing in accordance with the drive signal of the horizontal drive circuit 15, outputting the amplified signal to the signal processing circuit at the subsequent stage.

The ramp signal generation circuit 17 generates a ramp signal whose voltage falls at a constant gradient with time (slope voltage) as a reference signal to be referenced by the column signal processing circuit 14 at the time of AD conversion of the pixel signal, supplying the ramp signal to the column signal processing circuit 14.

The control circuit 18 controls driving of each of internal blocks of the imaging element 11. For example, the control circuit 18 generates a clock signal in accordance with a driving cycle of each block, supplying the clock signal to each block. Also, for example, the control circuit 18 controls readout of pixel signals from the pixels 21 to allow fast AD conversion of the pixel signals by the column signal processing circuit 14.

<Configurations of the Pixel and the Column Processing Section>

Figure 2:
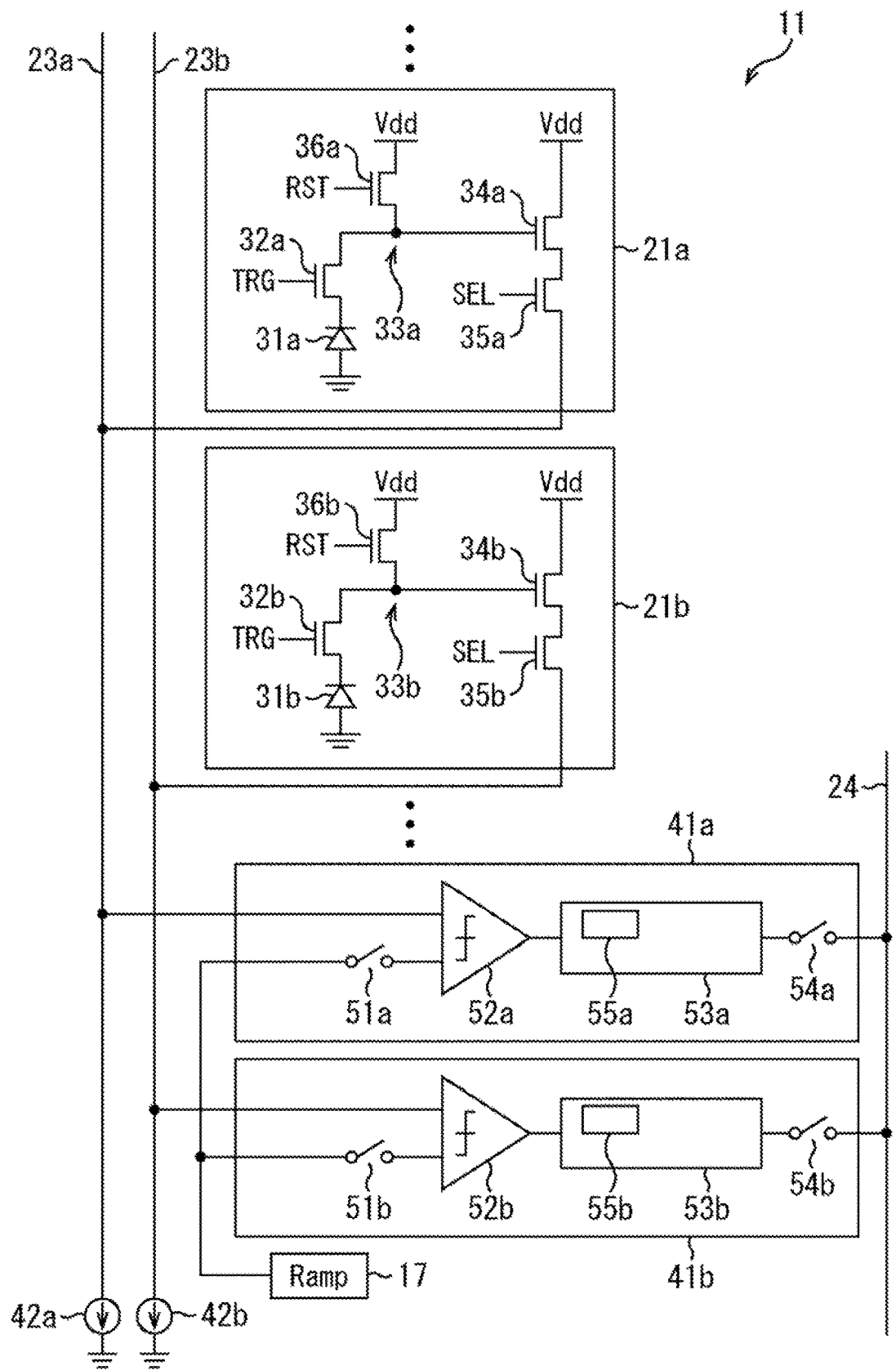
FIG. 2 is a diagram illustrating configurations of a pixel and a column processing section.

Next, FIG. 2 illustrates configuration examples of the pixel 21 and the column processing section 41 of the imaging element 11.

FIG. 2 illustrates, of the plurality of pixels 21 arranged in the pixel area 12 depicted in FIG. 1, two pixels 21a and 21b that are arranged side by side in a given column. Also, FIG. 2 illustrates, of the plurality of column processing sections 41 included in the column signal processing circuit 14, those arranged to correspond to this column.

As illustrated, two vertical signal lines or a first vertical signal line 23a and a second vertical signal line 23b are provided per column of the pixels 21 in the imaging element 11. The pixels 21a (e.g., the pixels 21 in odd-numbered rows) are connected to the first vertical signal line 23a, and the pixels 21b (e.g., the pixels 21 in even-numbered rows) are connected to the second vertical signal line 23b. Also, a constant current source 42a included in a source-follower circuit is connected to the first vertical signal line 23a, and a constant current source 42b included in a source-follower circuit is connected to the second vertical signal line 23b.

Then, the first vertical signal line 23a and the second vertical signal line 23b are connected to the respective column processing sections 41 that are arranged to correspond to this column. In the example illustrated in FIG. 2, a column processing section 41a is connected to the first vertical signal line 23a, and a column processing section 41b is connected to the second vertical signal line 23b.

The pixel 21a includes a PD 31a, a transfer transistor 32a, an FD section 33a, an amplifying transistor 34a, a selection transistor 35a, and a reset transistor 36a.

The PD 31a is a photoelectric conversion section that converts incident light into charge through photoelectric conversion and accumulates that charge. The PD 31a has its anode terminal grounded and its cathode terminal connected to the transfer transistor 32a.

The transfer transistor 32a is driven in accordance with a transfer signal TRG supplied from the vertical drive circuit 13. When the transfer transistor 32a turns ON, the charge accumulated in the PD 31a is transferred to the FD section 33a.

The FD section 33a is a floating diffusion area having a given storage capacitance connected to a gate electrode of the amplifying transistor 34a and accumulates the charge transferred from the PD 31a.

The amplifying transistor 34a outputs a pixel signal at the level proportional to the charge accumulated in the FD section 33a (i.e., at the potential of the FD section 33a) to the first vertical signal line 23a via the selection transistor 35a. That is, because of the configuration in which the FD section 33a is connected to the gate electrode of the amplifying transistor 34a, the FD section 33a and the amplifying transistor 34a function as a conversion section that converts charge that develops in the PD 31a into a pixel signal whose level is proportional to the charge.

The selection transistor 35a is driven in accordance with a selection signal SEL supplied from the vertical drive circuit 13. When the selection transistor 35a turns ON, the pixel signal output from the amplifying transistor 34a can be output to the first vertical signal line 23a.

The reset transistor 36a is driven in accordance with a reset signal RST supplied from the vertical drive circuit 13. When the reset transistor 36a turns ON, the charge accumulated in the FD section 33a is ejected into a power supply line Vdd, resetting the FD section 33a.

Also, the pixel 21b includes a PD 31b, a transfer transistor 32b, an FD section 33b, an amplifying transistor 34b, a selection transistor 35b, and a reset transistor 36b as with the pixel 21a. Hence, each section of the pixel 21b operates in a manner similar to each section of the pixel 21a as described above. Therefore, a detailed description thereof will be omitted. It should be noted that in the case where there is no need to distinguish between the pixel 21a and the pixel 21b, the pixels 21a and 21b will be hereinafter simply referred to as the pixels 21 as appropriate, and each section included in the pixels 21 will be referred to similarly.

The column processing section 41a includes an input switch 51a, a comparator 52a, a counter 53a, and an output switch 54a. It should be noted that the column processing section 41b has a similar configuration to that of the column processing section 41a. Therefore, a description will be given here by taking the column processing section 41a as an example. Also, in the case where there is no need to distinguish between the column processing section 41a and the column processing section 41b, these sections will be simply written as the column processing sections 41.

A negative input terminal of the comparator 52a of the column processing section 41a is connected to the first vertical signal line 23a. Also, a positive input terminal of the comparator 52a is connected to the ramp signal generation circuit 17 via the input switch 51a. An output terminal of the comparator 52a is connected to an input terminal of the counter 53a, and an output terminal of the counter 53a is connected to the data output signal line 24 via the output switch 54a.

Similarly, a negative input terminal of the comparator 52b of the column processing section 41b is connected to the second vertical signal line 23b. Also, a positive input terminal of the comparator 52b is connected to the ramp signal generation circuit 17 via the input switch 51b. An output terminal of the comparator 52b is connected to an input terminal of the counter 53b, and an output terminal of the counter 53b is connected to the data output signal line 24 via the output switch 54b.

The input switch 51a opens and closes in accordance with control performed by the control circuit 18 illustrated in FIG. 1 to switch connection to the positive input terminal of the comparator 52 over to connection regarding whether or not to input a ramp signal generated by the ramp signal generation circuit 17. The opening and closing of the input switch 51a and the input switch 51b are controlled such that one of them is closed and the other is open.

For example, when the input switch 51a is closed and the input switch 51b is opened, the positive input terminal of the comparator 52a is connected to the ramp signal generation circuit 17, and the positive input terminal of the comparator 52b is disconnected from the ramp signal generation circuit 17.

At this time, the pixel signal input via the first vertical signal line 23a and output from the pixel 21a and the ramp signal generated by the ramp signal generation circuit 17 are input to the comparator 52a.

On the other hand, the input switch 51b is open. Therefore, the ramp signal generated by the ramp signal generation circuit 17 is not input to the comparator 52b of the column processing section 41b. Thus, the opening and closing of the input switches 51 are controlled such that the ramp signal generated by the ramp signal generation circuit 17 is supplied to one of the column processing section 41a and the column processing section 41b.

The comparator 52 compares the ramp signal input to the positive input terminal and the pixel signal input to the negative input terminal in terms of magnitude and outputs a comparison result signal indicating the comparison result thereof. For example, in the case where the ramp signal is greater than the analog pixel signal, the comparator 52 outputs a comparison result signal at high level. In the case where the ramp signal falls below the analog pixel signal, the comparator 52 outputs a comparison result signal at low level.

The counter 53 counts a given number of clocks from when the potential of the ramp signal output from the ramp signal generation circuit 17 begins to drop with a constant gradient to when the comparison result signal output from the comparator 52 changes from high to low level. Hence, the count value counted by the counter 53 is proportional to the level of the pixel signal input to the comparator 52. As a result, the analog pixel signal output from the pixel 21 is converted into a digital value.

For example, a pixel signal at reset level where the FD section 33 of the pixel 21 is reset and a pixel signal at signal level where the FD section 33 of the pixel 21 holds charge obtained by photoelectric conversion by the PD 31 are output from the pixel 21 in the imaging element 11. Then, at the time of AD conversion of the pixel signal by the column processing section 41, the difference between these signals is found, thereby allowing a pixel signal free from reset noise to be output. Also, the counter 53 includes a holding section 55 that holds a count value, making it possible to temporarily hold the count value as will be described later.

The output switch 54 opens and closes in accordance with a drive signal output from the horizontal drive circuit 15. For example, when it is time to output a pixel signal of the column in which the given column processing section 41 is arranged, the output switch 54 is closed in accordance with a drive signal output from the horizontal drive circuit 15, thereby connecting the output terminal of the counter 53 to the data output signal line 24. As a result, the pixel signal obtained by AD conversion by the column processing section 41 is output to the data output signal line 24.

<Other Configurations of the Pixel and the Column Processing Section>

Figure 3:
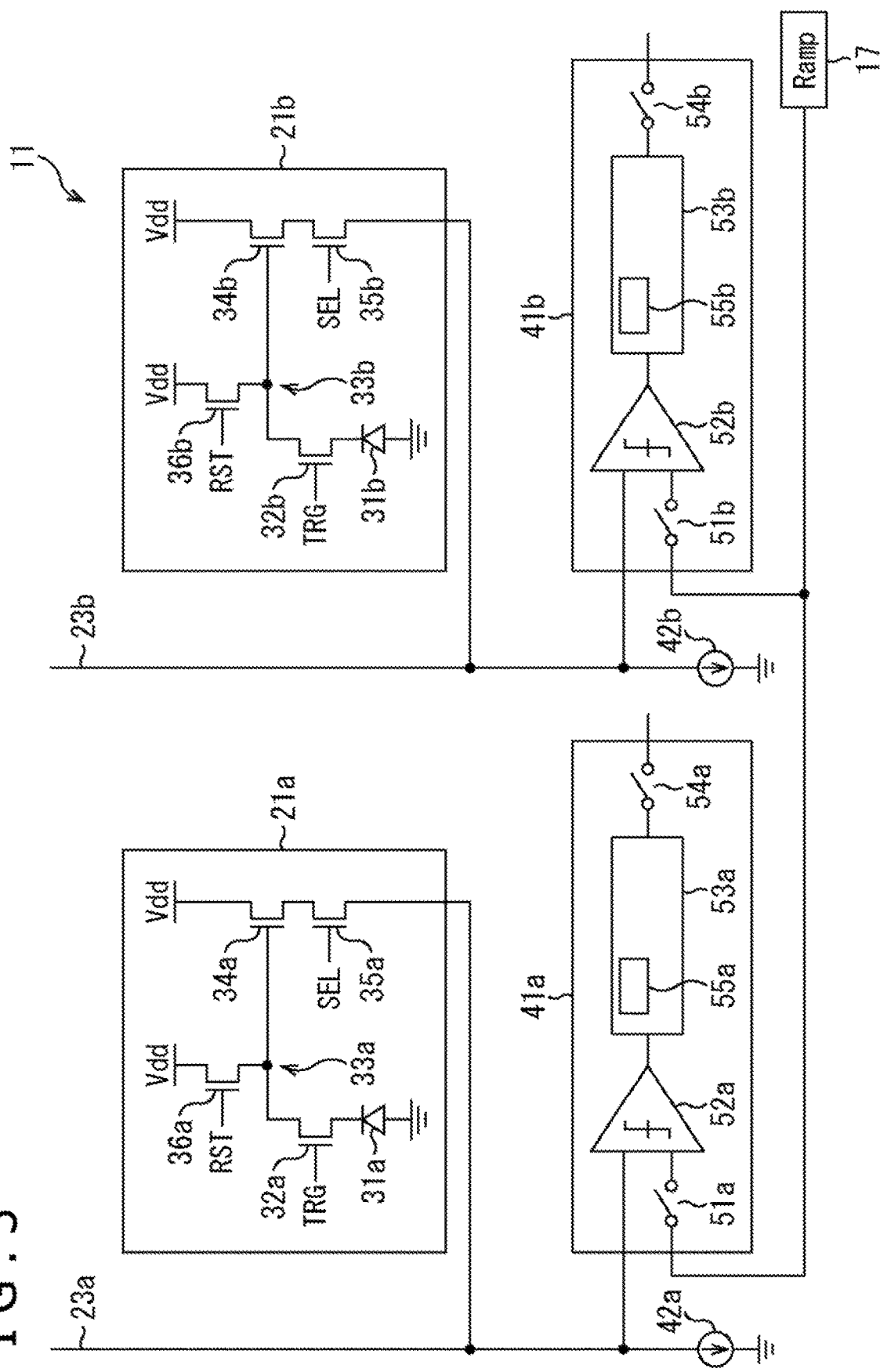
FIG. 3 is a diagram illustrating other configurations of the pixel and the column processing section.

FIG. 3 illustrates other configurations of the pixel 21 and the column processing section 41 of the imaging element 11.

Although similar in basic configuration to the imaging element 11 illustrated in FIG. 2, the imaging element 11 illustrated in FIG. 3 differs in that it includes the one vertical signal line 23 provided per column of pixels. That is, the imaging element 11 illustrated in FIG. 2 includes two vertical signal lines provided per column of pixels. However, the imaging element 11 illustrated in FIG. 3 includes one vertical signal line provided per column of pixels.

The pixel 21a and the pixel 21b are arranged in a row direction. The first vertical signal line 23a is connected to the pixel 21a. Although not illustrated, the pixels 21 are also arranged under the pixel 21a in the figure (in a column direction), and the one first vertical signal line 23a is connected to those pixels 21 arranged in the column direction.

Similarly, the second vertical signal line 23b is connected to the pixel 21b. Although not illustrated, the pixels 21 are also arranged under the pixel 21b in the figure (in the column direction), and the one second vertical signal line 23b is connected to those pixels 21 arranged in the column direction.

The first vertical signal line 23a is connected to the negative side of the comparator 52a of the column processing section 41a. Also, the ramp signal generation circuit 17 is connected to the positive side of the comparator 52a via the input switch 51a. The output terminal of the comparator 52a is connected to the input terminal of the counter 53a, and the output terminal of the counter 53a is connected to the data output signal line 24 via the output switch 54a.

Similarly, the negative input terminal of the comparator 52b of the column processing section 41b is connected to the second vertical signal line 23b. Also, the positive input terminal of the comparator 52b is connected to the ramp signal generation circuit 17 via the input switch 51b. The output terminal of the comparator 52b is connected to the input terminal of the counter 53b, and the output terminal of the counter 53b is connected to the data output signal line 24 via the output switch 54b.

As with the case illustrated in FIG. 2, the input switch 51a opens and closes in accordance with control performed by the control circuit 18 illustrated in FIG. 1 to switch connection to the positive input terminal of the comparator 52 over to connection regarding whether or not to input a ramp signal generated by the ramp signal generation circuit 17. The opening and closing of the input switch 51a and the input switch 51b are controlled such that one of them is closed and the other is open.

Thus, in the configuration illustrated in FIG. 3, one vertical signal line is provided per column of pixels, and the one column processing section 41 is arranged.

The imaging element 11 is thus configured, allowing the column processing section 41a and the column processing section 41b to perform AD conversion of the pixel signal output from the pixel 21a and the pixel signal output from the pixel 21b. Hence, the imaging element 11 can control pixel signal readout such that pixel signal settling, conducted by one of the pixels 21a and 21b through reset operation or signal transfer operation, and the AD conversion process in which the column processing section 41 performs AD conversion of the pixel signal output from the other pixel and held, can be carried out alternately and repeatedly.

Thus, the imaging element 11 can speed up AD conversion in the column processing section 41 by operating such that the AD conversion of pixel signals and the settling are conducted by the pixels 21a and 21b simultaneously in parallel and switched alternately.

<AD Conversion Operation>

Figure 4:
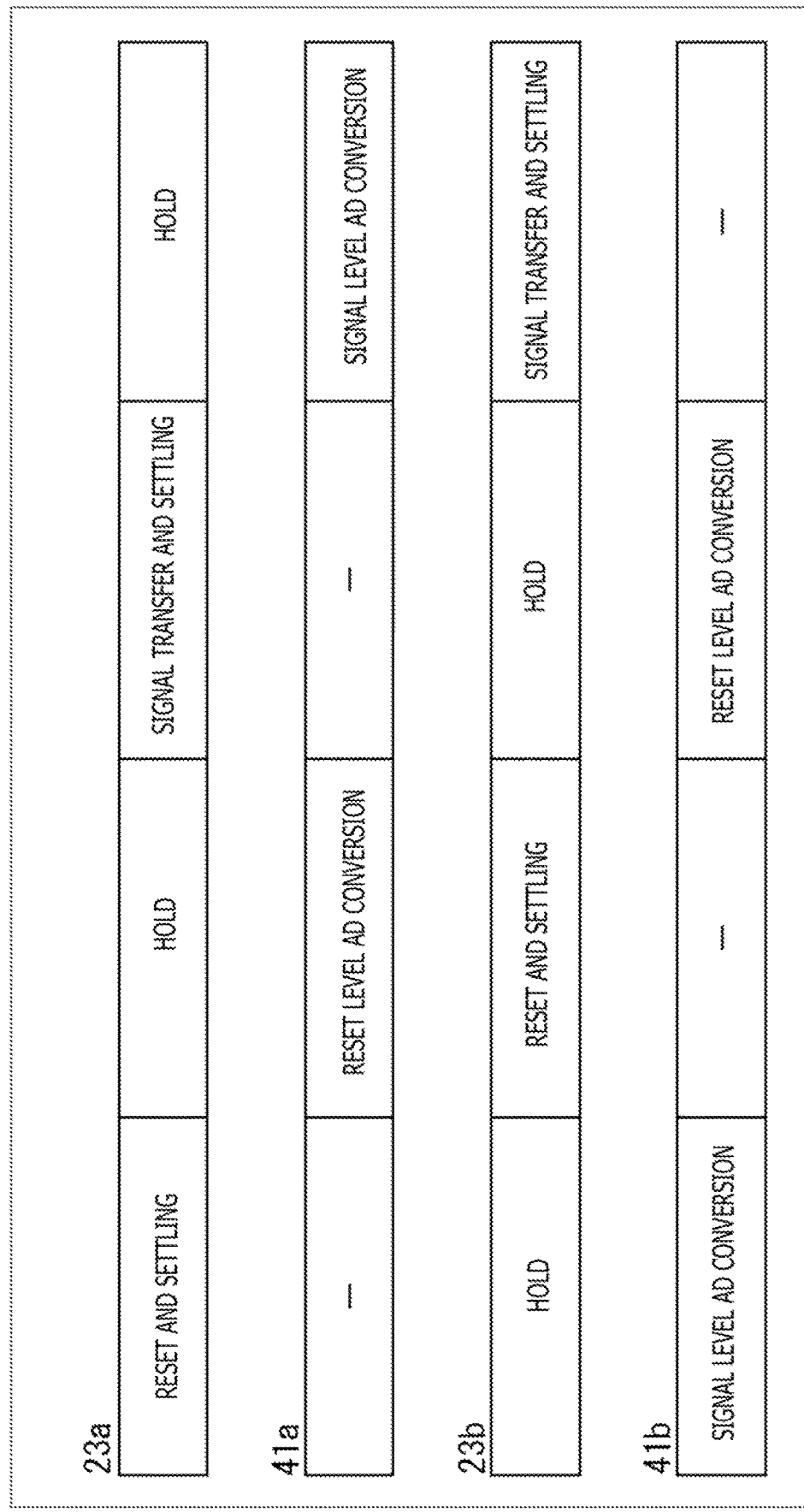
FIG. 4 is a timing diagram describing AD conversion operation taking place in an imaging element.

Next, FIG. 4 illustrates a timing diagram describing AD conversion operation taking place in the imaging element 11. The timing diagram illustrated in FIG. 4 is applicable both to the configuration illustrated in FIG. 2 and to the configuration illustrated in FIG. 3.

FIG. 4 illustrates, sequentially from top down, operation of the pixel 21a connected to the first vertical signal line 23a, operation of the column processing section 41a, operation of the pixel 21b connected to the second vertical signal line 23b, and operation of the column processing section 41a.

First, during a first operation period, the pixel 21a connected to the first vertical signal line 23a resets the FD section 33a and waits until the output of the pixel signal at reset level settles sufficiently (reset period). In parallel with this operation, during the first operation period, the pixel 21b connected to the second vertical signal line 23b continues to hold the output of the pixel signal at signal level proportional to the amount of light received by the PD 31b that settled during the previous operation period.

During a first operation period, although the column processing section 41a does not perform any processing, the column processing section 41b performs AD conversion of the pixel signal at signal level output from the pixel 21b (AD conversion period). At this time, the counter 53b of the column processing section 41b holds, in a holding section 55b, a count value corresponding to the pixel signal of the pixel 21b at signal level.

Next, during a second operation period, the pixel 21a connected to the first vertical signal line 23a continues to hold the output of the pixel signal at reset level that settled during the first operation period, and the column processing section 41a performs AD conversion of the pixel signal at signal level output from the pixel 21a.

In parallel with this operation, during the second operation period, the pixel 21b connected to the second vertical signal line 23b resets the FD section 33b and waits until the output of the pixel signal at reset level settles sufficiently. The column processing section 41b does not perform any processing.

Thereafter, during a third operation period, the pixel 21a connected to the first vertical signal line 23a transfers, to the FD section 33a, charge obtained by photoelectric conversion by the PD 31a and waits until the output of the pixel signal at signal level proportional to the amount of light received by the PD 31a settles sufficiently (signal transfer period). During the third operation period, the column processing section 41a does not perform any processing.

In parallel with this operation, during the third operation period, the pixel 21b connected to the second vertical signal line 23b continues to hold the output of the pixel signal at reset level that settled during the second operation period, and the column processing section 41b performs AD conversion of the pixel signal at reset level output from the pixel 21b.

Then, the column processing section 41b finds the difference between the count value corresponding to this pixel signal at reset level and the count value corresponding to the pixel signal of the pixel 21b at signal level held by the holding section 55b, outputting a pixel signal free from reset noise.

Then, during a fourth operation period, the pixel 21a connected to the first vertical signal line 23a continues to hold the output of the pixel signal at signal level that settled during the third operation period. The column processing section 41a performs AD conversion of the pixel signal at signal level output from the pixel 21a.

Then, the column processing section 41a finds the difference between the count value corresponding to this pixel signal at signal and the count value corresponding to the pixel signal of the pixel 21a at reset level held by the holding section 55a, outputting a pixel signal free from reset noise.

In parallel with this operation, during the fourth operation period, the pixel 21b connected to the second vertical signal line 23b transfers, to the FD section 33b, charge obtained by photoelectric conversion by the PD 31b and waits until the output of the pixel signal at signal level proportional to the amount of light received by the PD 31b settles sufficiently. Also, during the fourth operation period, the column processing section 41b does not perform any processing.

After the end of the fourth operation period, the AD conversion operation returns to the first operation period. Hereinafter, a similar procedure follows, selecting the pixels 21a and 21b in the next row as the pixels to be operated and repeating the operations from the first operation period to the fourth operation period sequentially. It should be noted that each of the operation periods may take place with a lag of half a cycle between the pixels 21a and 21b.

Thus, the imaging element 11 conducts AD conversion of the pixel signal of one of the pixels 21a and 21b and settling of the pixel signal of the other pixel in parallel. This makes it possible for the imaging element 11, for example, to conduct AD conversion of the pixel signal of the pixel 21a at reset level during the second operation period from immediately after the completion of AD conversion of the pixel signal of the pixel 21b at signal level during the first operation period.

Similarly, AD conversion of the pixel signal of the pixel 21b at reset level during the third operation period can be conducted from immediately after the completion of AD conversion of the pixel signal of the pixel 21a at reset level during the second operation period. Further, AD conversion of the pixel signal of the pixel 21a at signal level during the fourth operation period can be conducted from immediately after the completion of AD conversion of the pixel signal of the pixel 21b at reset level during the third operation period.

Hence, the imaging element 11 can perform AD conversion faster than in the configuration in which the column processing sections 41 wait until settling of the pixel signals before starting AD conversion.

<Ramp Signal>

A description will be given next of a ramp signal generated by the ramp signal generation circuit 17, in other words, a ramp signal supplied to the column processing section 41.

Figure 5:
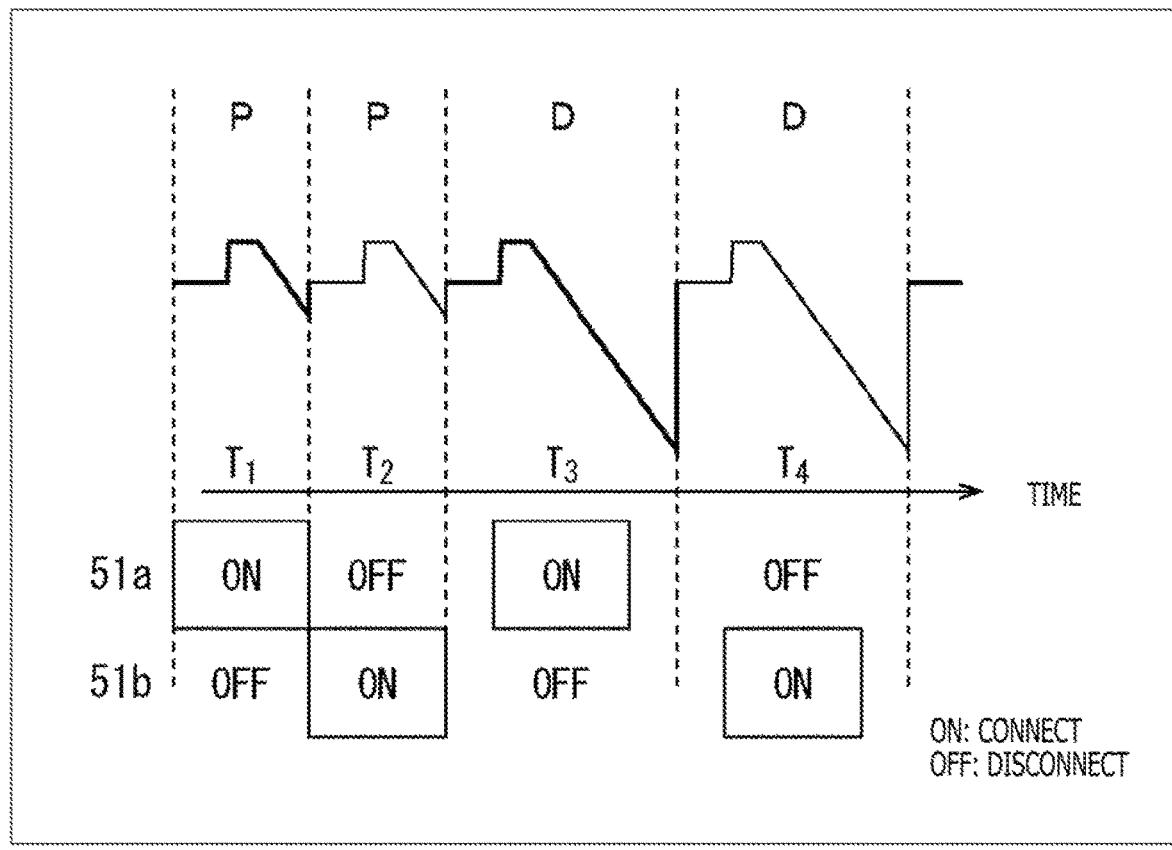
FIG. 5 is a diagram for describing a ramp signal generated by a ramp signal generation circuit.

FIG. 5 is a diagram illustrating a waveform of a ramp signal generated by the ramp signal generation circuit 17. Here, the pixel 21 from which a pixel signal is read first will be referred to as a primary pixel, and the pixel 21 from which a pixel signal is read later will be referred to as a secondary pixel.

A ramp signal includes a signal for reading out a pixel signal of the primary pixel at reset level (P phase) and a pixel signal of the primary pixel at signal level (D phase) and a signal for reading out a P phase and a D phase of the secondary pixel. The signals for the primary pixel will be denoted as primary ramp signals as appropriate, and the signals for the secondary pixel will be denoted as secondary ramp signals as appropriate.

In FIG. 5, the primary ramp signals are depicted by bold lines, and the secondary ramp signals are depicted by thin lines. First, the ramp signal generation circuit 17 generates, during a period T1, a primary ramp signal for reading out a pixel signal of the primary pixel at reset level (P phase). Thereafter, the ramp signal generation circuit 17 generates, during a period T2, a secondary ramp signal for reading out a pixel signal of the secondary pixel at reset level (P phase).

During a period T3 following the period T2, the ramp signal generation circuit 17 generates a primary ramp signal for reading out a pixel signal of the primary pixel at signal level (D phase). Thereafter, the ramp signal generation circuit 17 generates, during a period T4, a secondary ramp signal for reading out a pixel signal of the secondary pixel at signal level (D phase).

Thus, ramp signals are those signals in which primary and secondary ramp signals appear alternately. Here, reference will be made again to FIGS. 2 and 3. We assume here that the pixel 21a is a primary pixel and that the column processing section 41a is a column processing section 41 that processes a pixel signal from the primary pixel. We also assume that the pixel 21b is a secondary pixel and that the column processing section 41b is a column processing section 41 that processes a pixel signal from the secondary pixel.

The opening and closing of the input switch 51a and the input switch 51b are switched in accordance with a ramp signal. Specifically, when a primary ramp signal is supplied from the ramp signal generation circuit 17, the input switch 51a is connected, and the input switch 51b is disconnected. Also, when a secondary ramp signal is supplied from the ramp signal generation circuit 17, the input switch 51b is connected, and the input switch 51a is disconnected.

As illustrated in FIG. 5, when a primary ramp signal is generated during the period T1, the input switch 51a is connected (ON), and the input switch 51b is disconnected (OFF). When a secondary ramp signal is generated during the period T2, the input switch 51a is disconnected (OFF), and the input switch 51b is connected (ON).

When a primary ramp signal is generated during the period T3, the input switch 51a is connected (ON), and the input switch 51b is disconnected (OFF). When a secondary ramp signal is generated during the period T4, the input switch 51a is disconnected (OFF), and the input switch 51b is connected (ON).

Thus, the opening and closing of the input switches 51 are controlled in accordance with a ramp signal.

<Positions of the Switches for Controlling Supply of a Ramp Signal>

Figure 6:
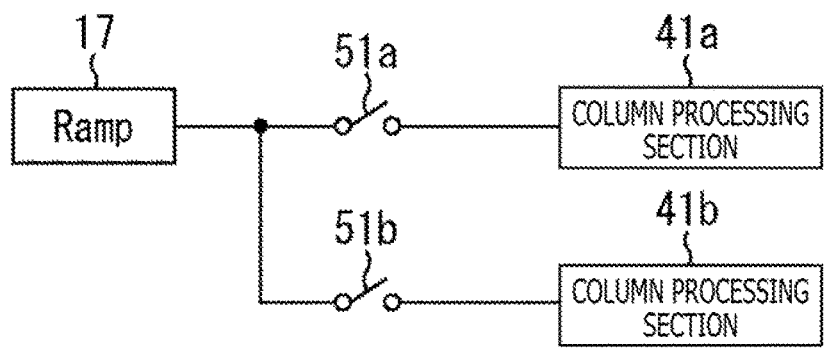
FIG. 6 is a diagram describing positions of switches for controlling supply of the ramp signal.
Figure 7:
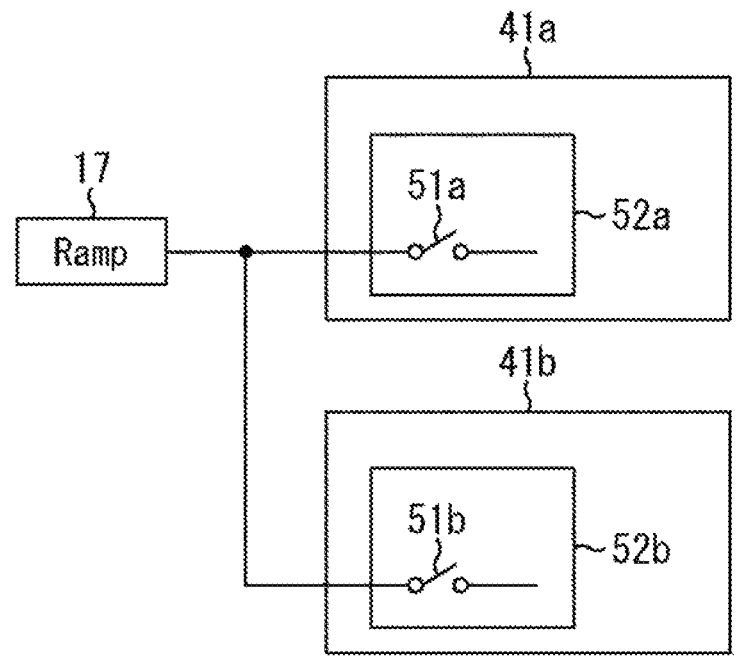
FIG. 7 is a diagram describing other positions of the switches for controlling the supply of the ramp signal.

A description will be given of the positions where the input switches 51, whose opening and closing are controlled in accordance with a ramp signal, are provided inside the imaging element 11 with reference to FIGS. 6 and 7. FIGS. 6 and 7 illustrate only the ramp signal generation circuit 17, the column processing sections 41, and the input switches 51 and illustrates the respective sections in a simplified manner.

As illustrated in FIG. 6, the input switches 51 are provided between the ramp signal generation circuit 17 and the column processing sections 41. The input switch 51a is provided between the ramp signal generation circuit 17 and the column processing section 41a. The input switch 51b is provided between the ramp signal generation circuit 17 and the column processing section 41b. A control signal that controls the opening and closing of the input switch 51a and the input switch 51b is supplied from the control circuit 18 (FIG. 1) which is not illustrated in FIG. 6.

As described above, the opening and closing of the input switch 51a and the input switch 51b are controlled such that when one of them is connected, the other is disconnected.

The input switches 51 may be provided outside the column processing sections 41 as illustrated in FIG. 6 and may also be provided inside the column processing sections 41 as illustrated in FIG. 2 (or FIG. 3).

FIG. 7 illustrates other positions where the input switches 51 are arranged. In the arrangement example illustrated in FIG. 7, the input switches 51 are provided inside the comparators 52 that are inside the column processing sections 41.

The input switch 51a is provided inside the comparator 52a that is inside the column processing section 41a. When the input switch 51a is connected, a ramp signal is supplied into the comparator 52a from the ramp signal generation circuit 17 so that voltage comparison takes place in the comparator 52a. However, when the input switch 51a is disconnected, there is only a break inside the comparator 52a. As a result, voltage comparison does not take place in the comparator 52a.

Similarly, the input switch 51b is provided inside the comparator 52b that is inside the column processing section 41b. When the input switch 51b is connected, a ramp signal is supplied to the comparator 52b from the ramp signal generation circuit 17 so that voltage comparison takes place in the comparator 52b. However, when the input switch 51b is disconnected, there is only a break inside the comparator 52b. As a result, voltage comparison does not take place in the comparator 52b.

Thus, the positions where the input switches 51 are arranged inside the imaging element 11 need only be positions where a state in which a ramp signal is supplied from the ramp signal generation circuit 17 and another state in which a ramp signal is not supplied therefrom can be switched from one to the other and where such switching can be controlled.

<Configurations of the Comparator and the Switch>

A further description will be given of the arrangement examples illustrated in FIGS. 6 and 7. Here, the description will be continued by taking, as an example, a case in which the comparator 52 includes a differential amplifier.

First, a description will be given of the configuration in which the comparator 52 includes a differential amplifier with reference to FIG. 8. In the basic configuration of the comparator 52, a generally known differential amplifier configuration is used. The differential amplifier includes a differential transistor pair section, a load transistor pair section, and a current source section. The differential transistor pair section has NMOS type transistors 105 and 106. The load transistor pair section has PMOS transistors 101 and 102, an output load of the differential transistor pair section, and is provided on a power supply side. The current source section has an NMOS constant current source transistor 109 provided on a ground side (GND) to supply a constant operating current to each section.

Respective sources of the transistors 105 and 106 are commonly connected to the drain of the constant current source transistor 109, and respective drains of the corresponding transistors 101 and 102 of the load transistor pair section are connected to respective drains (output terminals) of the transistors 105 and 106. A DC gate voltage is input to a gate of the constant current source transistor 109.

The output of the differential transistor pair section (drain of the transistor 106 in the illustrated example) is connected to an amplifier which is not illustrated. The output goes further through a buffer which is not illustrated and where it is sufficiently amplified, after which the output is output to the counter 53 (FIG. 2).

Also, an operating point reset section is provided to reset an operating point of the comparator 52. The operating point reset section functions as an offset removing section. That is, the comparator 52 is configured as a voltage comparator having an offset removing function. The operating point reset section has switching transistors 103 and 104 and capacitive elements 107 and 108 for signal coupling.

Here, the switching transistor 103 is connected between a gate (input terminal) and a drain (output terminal) of the transistor 105. Also, the switching transistor 104 is connected between a gate (input terminal) and a drain (output terminal) of the transistor 106. A common comparator reset pulse PSET is commonly supplied to each of the gates.

Also, a ramp signal is supplied to the gate (input terminal) of the transistor 105 from the ramp signal generation circuit 17 which is not illustrated via the capacitive element 107. A pixel signal is supplied to the gate (input terminal) of the transistor 106 from the pixel 21 via the capacitive element 108.

In such a configuration, the operating point reset section has a function to sample and hold a signal input via the capacitive element 107 or 108. That is, the comparator reset pulse is activated only immediately before comparison between the pixel signal and the ramp signal begins, resetting the operating point of the differential transistor pair section to a drain voltage (readout potential; operational reference value where a reference component and a signal component are read out). Thereafter, a pixel signal is input to the transistor 106 via the capacitive element 108, and a ramp signal is input via the capacitive element 107, conducting comparison until the pixel signal and the ramp signal reach the same potential. The output is inverted when the pixel signal and the ramp signal reach the same potential.

Figure 8:
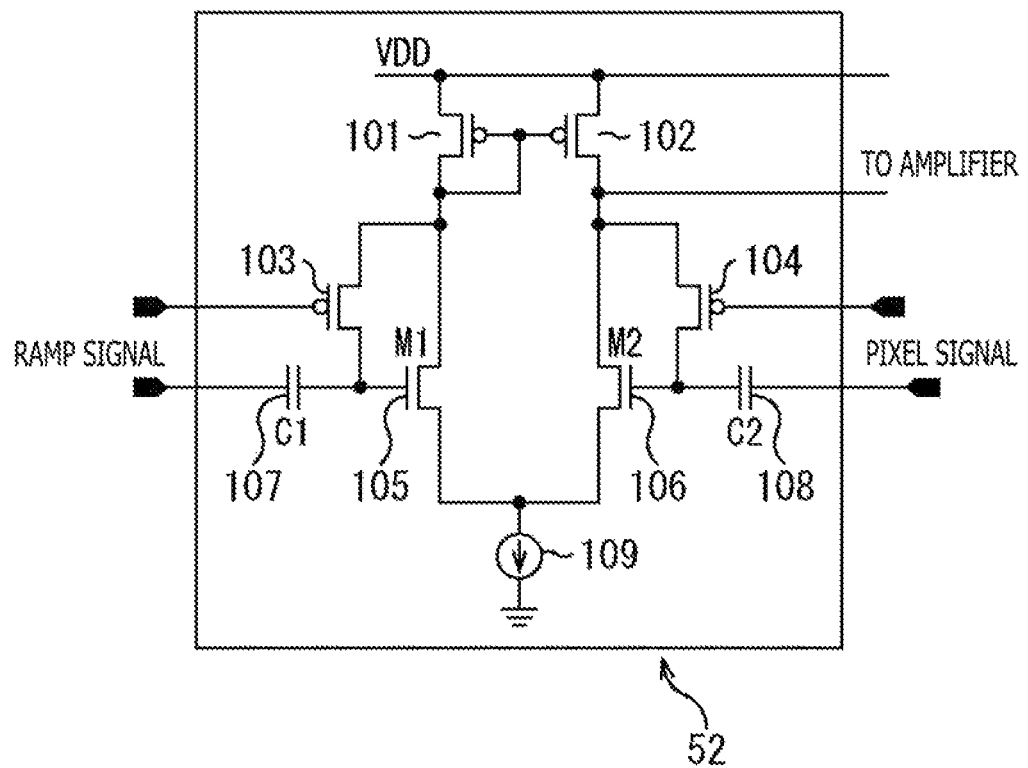
FIG. 8 is a diagram for describing a configuration of a comparator.

A description will be given of a case in which the input switch 51 is arranged at the position illustrated in FIG. 6 or FIG. 7 when the comparator 52 is configured as illustrated in FIG. 8. In the description given below, we assume that the comparator 52 is configured as illustrated in FIG. 8, and the description regarding the comparator 52 will be omitted.

Example 1 of Switch Arrangement

Figure 9:
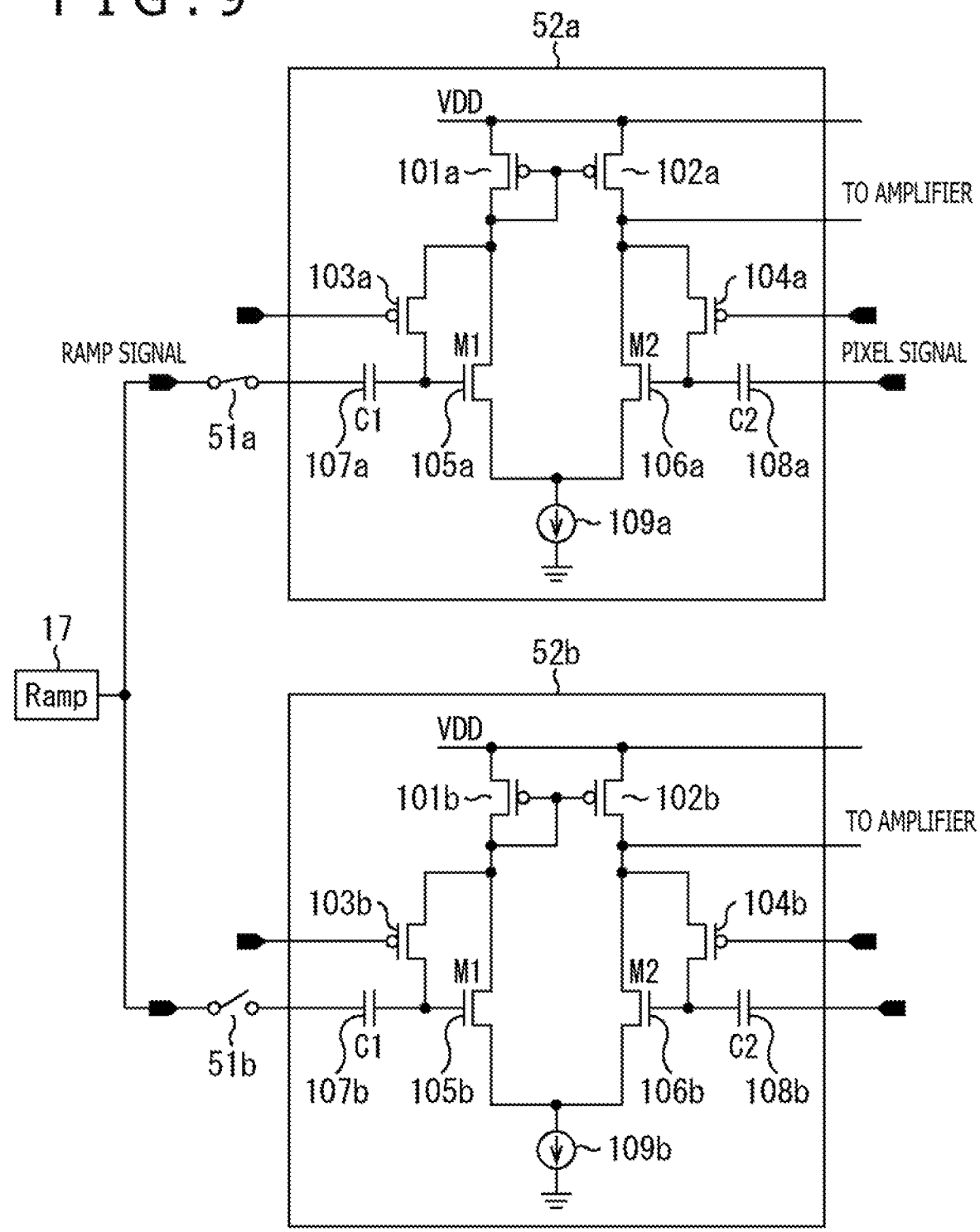
FIG. 9 is a diagram for describing configurations of the comparator and the switch.

FIG. 9 is a diagram illustrating an example of a case in which, as illustrated in FIG. 6, the input switches 51 are provided between the ramp signal generation circuit 17 and the column processing sections 41.

The input switch 51a is provided between the ramp signal generation circuit 17 and the comparator 52a of the column processing section 41a and is connected to a capacitive element 107a of the comparator 52a. Similarly, the input switch 51b is provided between the ramp signal generation circuit 17 and the comparator 52b of the column processing section 41b and is connected to a capacitive element 107b of the comparator 52b.

FIG. 9 illustrates a case in which the input switch 51a is connected and the input switch 51b is disconnected. As illustrated in FIG. 9, a configuration can be used in which interrupting circuits (input switches 51) are provided in paths where ramp signals (reference signals) of the comparators 52 of the plurality of column processing sections 41 arranged in parallel are transferred and in which the interrupting circuits are controlled to turn ON and OFF in a time-shared manner in synchronism with the AD conversion timing.

Even in the case of such a configuration, and further in the case of a configuration illustrated in FIG. 2 having the two vertical signal lines 23 per column of pixels and having the column processing sections 41 connected to the respective vertical signal lines 23, only one of the column processing section 41a and the column processing section 41b is connected to the ramp signal generation circuit 17 at a given timing.

Also, even in the case of a configuration having the one vertical signal line 23 per column of pixels and a configuration having the column processing sections 41 connected to the respective vertical signal lines 23 as illustrated in FIG. 3, only one of the column processing section 41a and the column processing section 41b is connected to the ramp signal generation circuit 17 at a given timing.

Accordingly, the present technology ensures that half of the column processing sections 41, included in the imaging element 11, are connected to the ramp signal generation circuit 17 at a given timing. This makes it possible to keep possible errors in CDS value to a minimum.

Referring to FIG. 9 and so on, the column processing section 41 has capacitances including that of the capacitive element 107. Accordingly, an increase in the number of column processing sections 41 connected to the ramp signal generation circuit 17 as a result of parallel arrangement of the column processing sections 41 leads to a larger capacitance value that acts as a load for the ramp signal generation circuit 17.

The reset level is determined almost at the same timing in a concentrated manner in all the column processing sections 41. In contrast, the signal level is possibly determined at varying timings because there is no correlation between the signal levels input to the respective column processing sections 41. This variation may result in error in CDS value.

The present technology ensures that half of the column processing sections 41, included in the imaging element 11, are connected to the ramp signal generation circuit 17 at a given timing as described above. As a result, the load for the ramp signal generation circuit 17 is smaller, allowing for reduced errors in CDS value (noise) resulting from varying timings of signal level determination by the column processing sections 41.

Also, the present technology can reduce, in a time-shared manner, the number of connected AD converters, load capacitances for the ramp signal generation circuit 17, that are arranged in a column parallel manner, alleviating delay modulation of the ramp signal (reference signal) caused by input capacitance change due to the states of the column processing sections 41 (comparators 52 inside the column processing sections 41) included in the AD converters and keeping errors in CDS value to a minimum.

Also, the present technology permits generation of a ramp signal with the single ramp signal generation circuit 17 even in the case where a ramp signal is generated for two pixels, primary and secondary pixels, as described above. This eliminates the need to provide the plurality of ramp signal generation circuits 17, preventing increased power consumption and preventing an increase in the area of the imaging element 11.

Also, in the case where the plurality of ramp signal generation circuits 17 are provided, variations in accuracy between the respective ramp signal generation circuits 17 possibly leads to adverse impacts such as occurrence of error in CDS value. However, in the present technology, processing takes place in the single ramp signal generation circuit 17, thereby ensuring freedom from such adverse impacts.

Example 2 of Switch Arrangement

Figure 10:
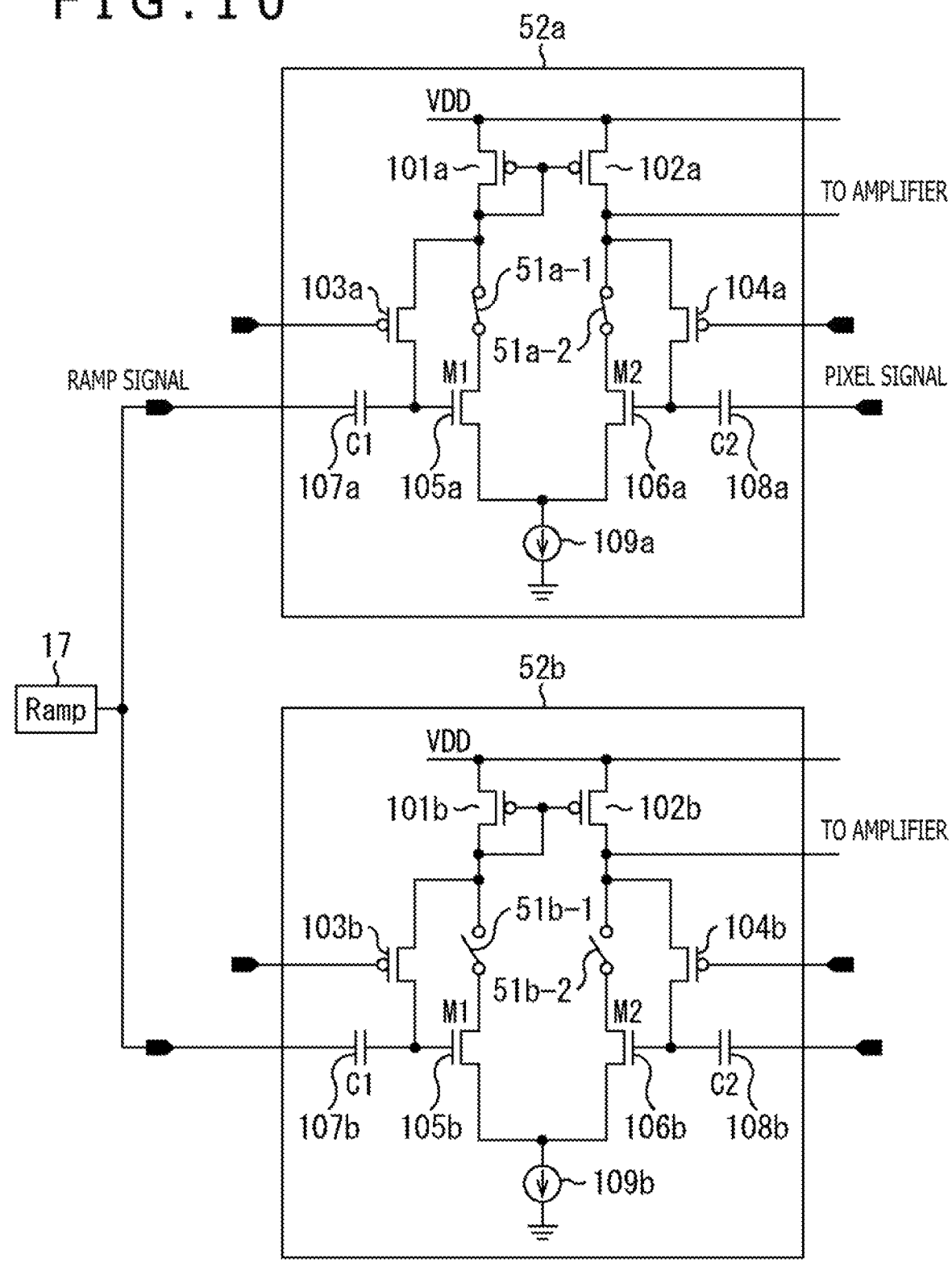
FIG. 10 is a diagram for describing configurations of the comparator and the switch.

FIG. 10 is a diagram illustrating an example of a case in which, as illustrated in FIG. 7, the input switches 51 are provided between the ramp signal generation circuit 17 and the column processing sections 41.

The input switch 51a is provided inside the comparator 52a of the column processing section 41a and is arranged at a position that ensures that comparison and determination do not take place in the comparator 52a when the input switch 51a is open and that comparison and determination take place in the comparator 52a when the input switch 51a is connected.

Similarly, the input switch 51b is provided inside the comparator 52b of the column processing section 41b and is arranged at a position that ensures that comparison and determination do not take place in the comparator 52b when the input switch 51b is open and that comparison and determination take place in the comparator 52b when the input switch 51b is connected.

Referring to the comparator 52a illustrated in FIG. 10, an input switch 51a-1 is provided between a transistor 101a and a transistor 105a, and an input switch 51a-2 is provided between a transistor 102a and a transistor 106a.

The opening and closing of the input switch 51a-1 and the input switch 51a-2 are controlled in the same manner. When the input switch 51a-1 is connected, the input switch 51a-2 is also connected. When the input switch 51a-1 is disconnected, the input switch 51a-2 is also disconnected.

As the input switch 51a-1 is connected, a ramp signal generated by the ramp signal generation circuit 17 is supplied into the comparator 52a. As the input switch 51a-2 is connected, a pixel signal from the pixel 21a (FIG. 2) is supplied into the comparator 52a.

Thus, when the ramp signal and the pixel signal are input, the comparator 52a can compare the ramp signal and the pixel signal and, therefore, performs comparison and outputs the comparison result thereof.

Similarly, in the comparator 52b, as an input switch 51b-1 is connected, a ramp signal generated by the ramp signal generation circuit 17 is supplied into the comparator 52b. As an input switch 51b-2 is connected, a pixel signal from the pixel 21b (FIG. 2) is supplied into the comparator 52b.

Thus, when the ramp signal and the pixel signal are input to the comparator 52b, the comparator 52b can compare the ramp signal and the pixel signal and, therefore, performs comparison and outputs the comparison result thereof.

The state illustrated in FIG. 10 is a state in which the input switches 51a inside the comparator 52a are connected and the input switches 51b inside the comparator 52b are disconnected. Accordingly, in the state illustrated in FIG. 10, although comparison and determination take place in the comparator 52a, comparison and determination do not take place in the comparator 52b.

A configuration can be used, as illustrated in FIG. 10, in which interrupting circuits (input switches 51) are provided in current paths of the comparators 52 (differential input transistors) of the plurality of column processing sections 41 arranged in parallel and in which the interrupting circuits are controlled to turn ON and OFF in a time-shared manner in synchronism with the AD conversion timing.

Even in the case of such a configuration, and further in the case of a configuration illustrated in FIG. 2 having the two vertical signal lines 23 per column of pixels and having the column processing sections 41 connected to the respective vertical signal lines 23, only one of the column processing section 41a and the column processing section 41b is connected to the ramp signal generation circuit 17 at a given timing.

Also, even in the case of a configuration having the one vertical signal line 23 per column of pixels and a configuration having the column processing sections 41 connected to the respective vertical signal lines 23 as illustrated in FIG. 3, only one of the column processing section 41a and the column processing section 41b is connected to the ramp signal generation circuit 17 at a given timing.

Accordingly, as with the case described with reference to FIG. 9, the present technology ensures that half of the column processing sections 41, included in the imaging element 11, are connected to the ramp signal generation circuit 17 at a given timing. This makes it possible to keep possible errors in CDS value to a minimum, preventing increased power consumption and preventing an increase in the area of the imaging element 11.

Example 3 of Switch Arrangement

Figure 11:
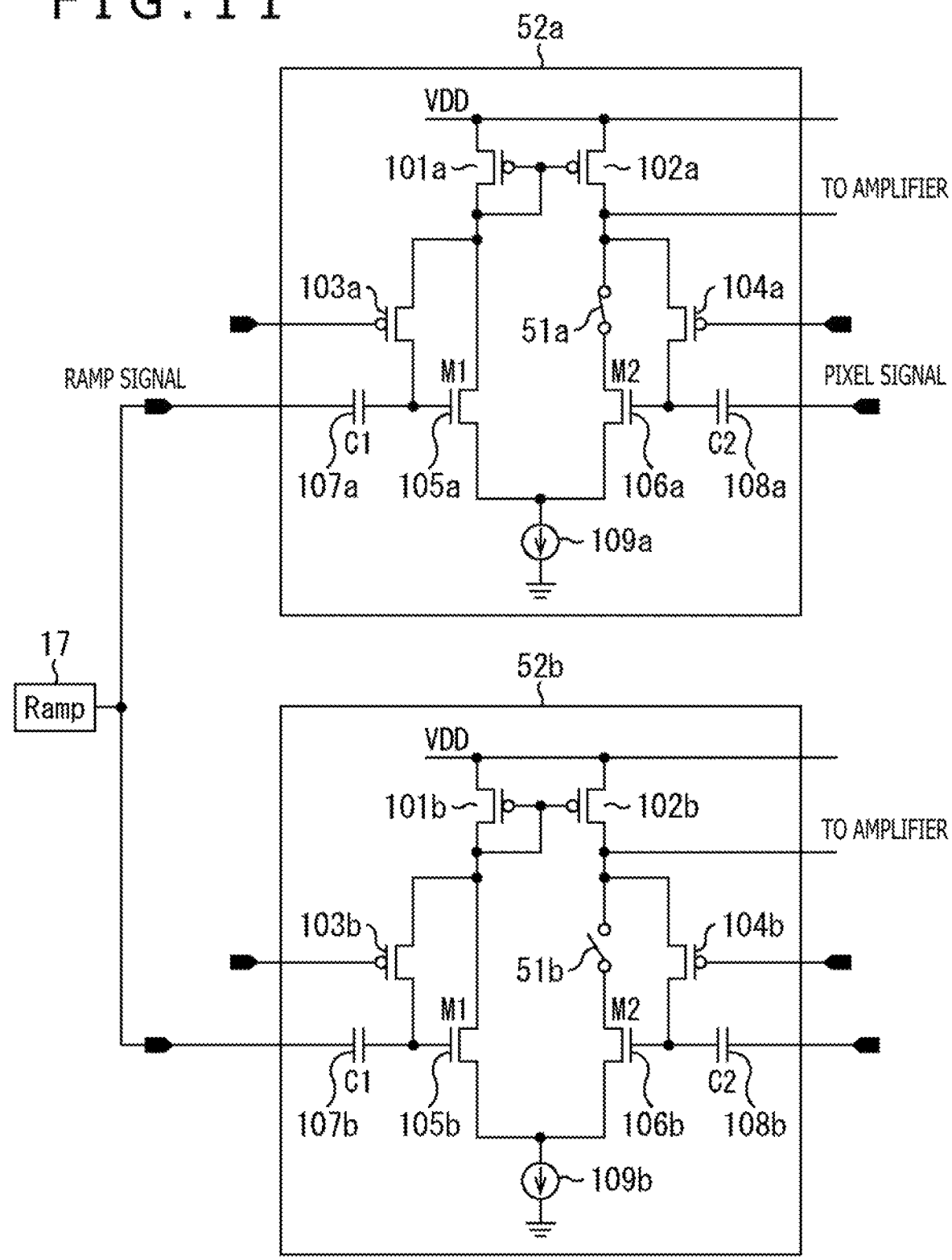
FIG. 11 is a diagram for describing configurations of the comparator and the switch.

FIG. 11 is a diagram illustrating an example of a case in which, as illustrated in FIG. 7, the input switches 51 are provided inside the comparators 52 that are inside the column processing sections 41. Although the example illustrated in FIG. 10 depicted an example in which the two input switches 51 are provided in the column processing section 41, a configuration can be used in which the single input switch 51 is provided rather than the two input switches 51.

The input switch 51a is provided inside the comparator 52a of the column processing section 41a and is arranged at a position that ensures that comparison and determination do not take place in the comparator 52a when the input switch 51a is open and that comparison and determination take place in the comparator 52a when the input switch 51a is connected.

Similarly, the input switch 51b is provided inside the comparator 52b of the column processing section 41b and is arranged at a position that ensures that comparison and determination do not take place in the comparator 52b when the input switch 51b is open and that comparison and determination take place in the comparator 52b when the input switch 51b is connected.

Specifically, referring to the comparator 52a illustrated in FIG. 11, the input switch 51a is provided between the transistor 102a and the transistor 106a. As the input switch 51a is connected, a pixel signal from the pixel 21a (FIG. 2) is supplied into the comparator 52a.

Thus, as the input switch 51a is connected, followed by input of a pixel signal, a ramp signal and the pixel signal are input, allowing the comparator 52a to compare the ramp signal and the pixel signal, after which the comparator 52a performs comparison and outputs the comparison result thereof.

Similarly, referring to the comparator 52b illustrated in FIG. 11, the input switch 51b is provided between the transistor 102b and the transistor 106b. As the input switch 51b is connected, a pixel signal from the pixel 21b (FIG. 2) is supplied into the comparator 52b.

Thus, as the input switch 51b is connected, followed by input of a pixel signal, a ramp signal and the pixel signal are input, allowing the comparator 52b to compare the ramp signal and the pixel signal, after which the comparator 52b performs comparison and outputs the comparison result thereof.

It should be noted that although a case was taken here as an example in which the input switch 51 is provided on the side where a pixel signal is input, a configuration may be used in which the input switch 51 is provided on the side where a ramp signal is input, that is, between the transistor 101 and the transistor 105.

The state illustrated in FIG. 11 is a state in which the input switch 51a inside the comparator 52a is connected and the input switch 51b inside the comparator 52b is disconnected. Accordingly, in the state illustrated in FIG. 11, although comparison and determination take place in the comparator 52a, comparison and determination do not take place in the comparator 52b.

As illustrated in FIG. 11, a configuration can be used in which an interrupting circuit (input switch 51) is provided in one of the current paths inside the comparators 52 (differential input transistor) of the plurality of column processing sections 41 arranged in parallel and in which the interrupting circuits are controlled to turn ON and OFF in a time-shared manner in synchronism with the AD conversion timing.

Even in the case of such a configuration, and further in the case of a configuration illustrated in FIG. 2 having the two vertical signal lines 23 per column of pixels and having the column processing sections 41 connected to the respective vertical signal lines 23, a pixel signal is input only to one of the column processing section 41a and the column processing section 41b at a given timing.

Also, even in the case of a configuration having the one vertical signal line 23 per column of pixels and a configuration having the column processing sections 41 connected to the respective vertical signal lines 23 as illustrated in FIG. 3, a pixel signal is input only to one of the column processing section 41a and the column processing section 41b at a given timing.

Accordingly, the present technology ensures that half of the column processing sections 41, included in the imaging element 11, are connected to the ramp signal generation circuit 17 at a given timing. This makes it possible to keep possible errors in CDS value to a minimum, preventing increased power consumption and preventing an increase in the area of the imaging element 11.

It should be noted that although, in the present embodiment, a description was given of a configuration example (FIG. 2) in which two vertical signal lines or the first vertical signal line 23a and the second vertical signal line 23b are provided per column of the pixels 21 arranged in a matrix form in the pixel area 12 or a configuration example (FIG. 3) in which two vertical signal lines or the first vertical signal line 23a and the second vertical signal line 23b are provided per two columns of the pixels 21 arranged in a matrix form in the pixel area 12. However, a configuration may be used in which the plurality of vertical signal lines 23, equal to or more than two, are provided.

For example, in the example illustrated in FIG. 2, nearly the same amount of time was required for settling and holding of a pixel signal. However, if a pixel signal holding time can be shortened, it is possible to perform, during settling of pixel signals of a plurality of pixels, AD conversion of pixel signals output from a plurality of other pixels by speeding up the AD conversion process itself. This can speed up the AD conversion process as a whole.

Also, the imaging element 11 is applicable both to a front-illuminated CMOS image sensor and a back-illuminated CMOS image sensor. In the front-illuminated CMOS image sensor, light is illuminated onto a front surface of a semiconductor substrate having the pixels 21 formed thereon on which interconnect layers are stacked. In the back-illuminated CMOS image sensor, light is illuminated onto a back surface on the opposite side of the front surface. The imaging element 11 is also applicable to a stacked CMOS image sensor that includes a sensor substrate and a circuit substrate. The sensor substrate and the circuit substrate are stacked onto one another, with the pixels 21 formed on the sensor substrate and the control circuits 18 (FIG. 1) and other circuits formed on the circuit substrate. Also, the process of reading out a pixel signal and performing AD conversion thereof can be realized by execution of a program by the control circuit 18 as described above.

<Example of Application to a Piece of Electronic Equipment>

It should be noted that the imaging element 11 in each of the embodiments described above is applicable to a variety of pieces of electronic equipment including imaging system such as digital still camera and digital video camera, mobile phone having an imaging function, or other pieces of equipment having an imaging function, for example.

Figure 12:
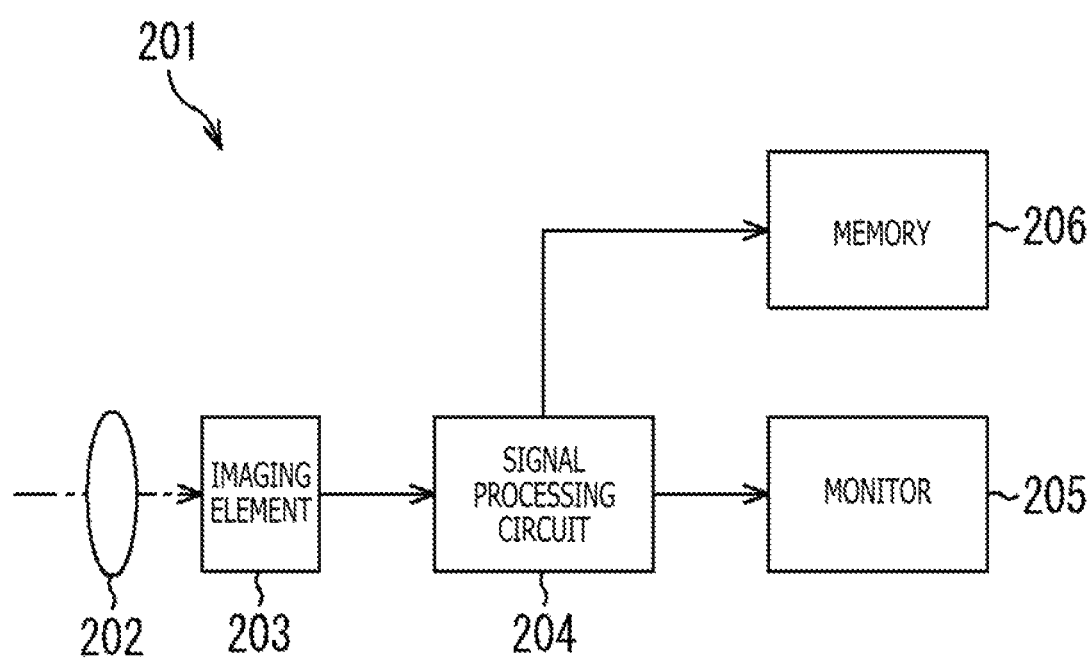
FIG. 12 is a diagram for describing an example of application to a piece of electronic equipment.

FIG. 12 is a block diagram illustrating a configuration example of an imaging apparatus included in electronic equipment.

As illustrated in FIG. 12, an imaging apparatus 201 includes an optics 202, an imaging element 203, a signal processing circuit 204, a monitor 205, and a memory 206 and can capture still images and videos.

The optics 202 includes one or a plurality of lenses and forms an image on a light-receiving surface (sensor section) of the imaging element 203 by guiding image light (incident light) from a subject onto the imaging element 203.

The imaging element 11 in each of the embodiments described above is used as the imaging element 203. The imaging element 203 accumulates, for a fixed period of time, electrons proportional to the image formed on the light-receiving surface via the optics 202. Then, a signal proportional to the electrons accumulated by the imaging element 203 is supplied to the signal processing circuit 204.

The signal processing circuit 204 performs a variety of signal processing tasks on the pixel signal output from the imaging element 203. An image (image data) obtained from signal processing by the signal processing circuit 204 is supplied to and displayed on the monitor 205 and supplied to and stored (recorded) in the memory 206.

The imaging apparatus 201 thus configured can, for example, capture images at a higher frame rate by applying the imaging element 11 in each of the embodiments described above and speeding up the AD conversion process.

<Usage Example>

Figure 13:
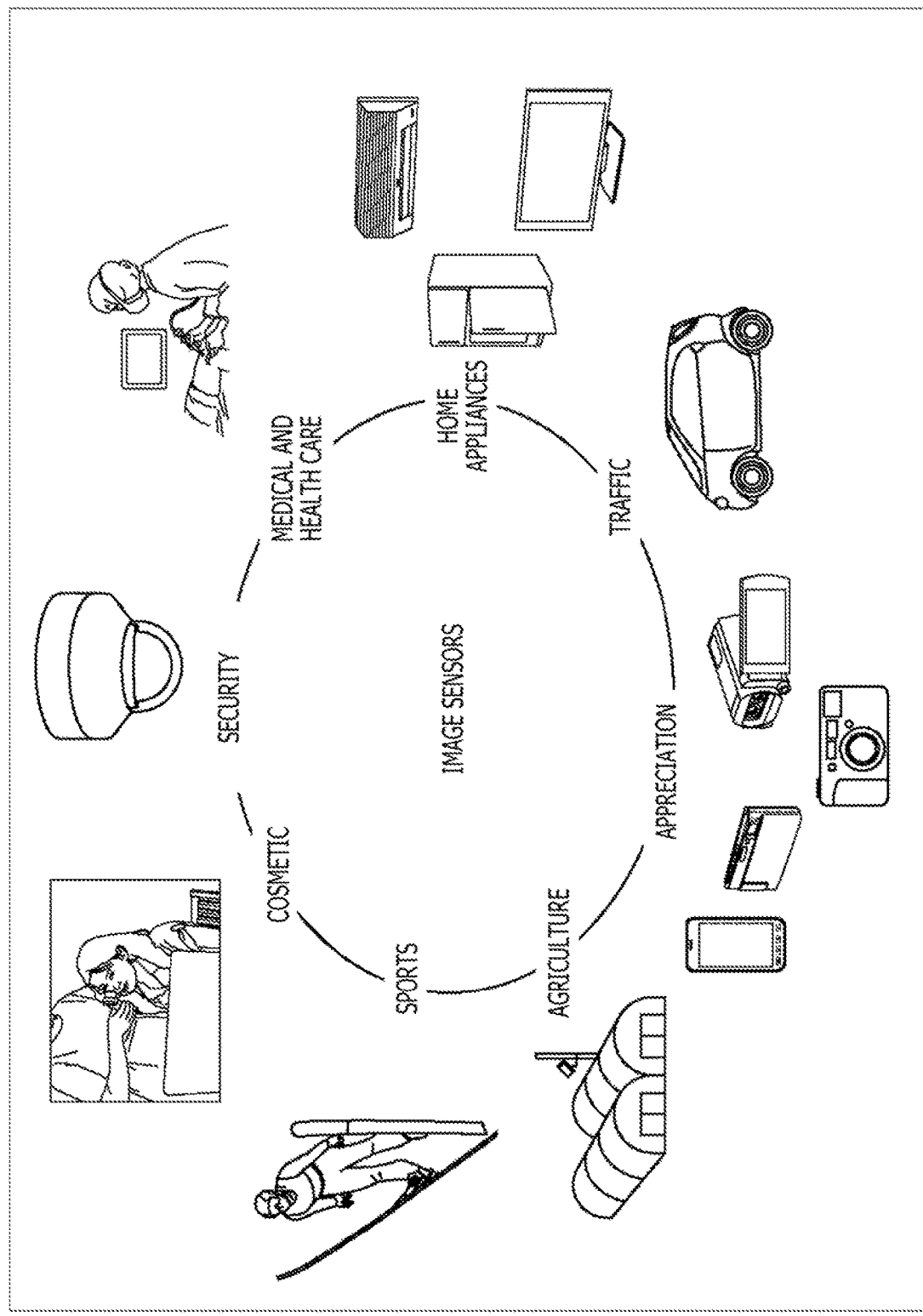
FIG. 13 is a diagram for describing a usage example of the imaging element.

FIG. 13 is a diagram illustrating a usage example of the image sensor described above.

The image sensor described above can find application, for example, in a variety of cases where visible light, infrared light, ultraviolet light, X-ray, and other light are sensed as described below.

- Apparatuses for shooting images for appreciation such as digital camera and mobile phone having a camera function
- Apparatuses for traffic use such as vehicle-mounted sensor for shooting front, back, surroundings, inside, and so on of an automobile for safe driving such as automatic stop and for recognition of driver's state, monitoring camera for monitoring traveling vehicles and road, and distance measuring sensor for measuring vehicle-to-vehicle distance and so on
- Apparatuses for use in home appliances such as television, refrigerator, and air-conditioner to shoot a user's gesture and operate the appliance in accordance with the gesture
- Apparatuses for medical and healthcare use such as endoscope and apparatus for shooting blood cells by receiving infrared light
- Apparatuses for security use such as monitoring camera for crime prevention and camera for individual authentication
- Apparatuses for cosmetic use such as skin measuring device for shooting skin and microscope for shooting scalp
- Apparatuses for sports use such as action camera and wearable camera for sports applications
- Apparatuses for agricultural use such as camera for monitoring fields and crops It should be noted that the present technology can have the following configurations:

(1)

An imaging element including:

a pixel area having a plurality of pixels arranged in a matrix form;

a column AD signal processing section having, for each pixel column, an AD conversion section for converting pixel signals output from the pixels from analog into digital form (performing AD (Analog to Digital) conversion), with the plurality of pixels, arranged in the same column, connected to the AD conversion section via a vertical signal line; and a ramp signal generation section adapted to generate a ramp signal, in which the AD conversion section performs an operation of converting, in parallel with reset operation or signal transfer operation performed by the pixels connected via some of a given number of vertical signal lines, the pixel signals output from the pixels connected via other vertical signal lines from analog to digital form, with these operations being carried out alternately and repeatedly, and the ramp signal is controlled in such a manner as to be supplied to the AD conversion sections that perform AD conversion of the pixel signals output from the pixels and not supplied to the AD conversion sections that do not perform AD conversion.

(2)

The imaging element of feature (1), in which the control is achieved by controlling opening and closing of a switch, and the switch is provided on a path between the ramp signal generation section and the AD conversion section.

(3)

The imaging element of feature (1), in which the control is achieved by controlling opening and closing of a switch, and the switch is provided inside a comparator included in the AD conversion section.

(4)

The imaging element of feature (3), in which the switch is provided on a current path inside the comparator.

(5)

The imaging element of feature (3), in which the switch is provided on a current path on one of two sides inside the comparator, the side where a signal from the pixel is processed and the side where a ramp signal from the ramp signal generation section is processed.

(6)

The imaging element of any one of features (1) to (5), in which the ramp signal generation section generates ramp signals individually for reading out a pixel signal of a first pixel at reset level, a pixel signal of a second pixel at reset level, a pixel signal of the first pixel at signal level, and a pixel signal of the second pixel at signal level repeatedly in this order, with the control being achieved by controlling opening and closing of a switch, and the switch is switched from an open state to a closed state or vice versa when the ramp signals are switched from one to another.

(7)

An imaging method of an imaging element, the imaging element including a pixel area having a plurality of pixels arranged in a matrix form, a column AD signal processing section having, for each pixel column, an AD conversion section for converting pixel signals output from the pixels from analog into digital form (performing AD (Analog to Digital) conversion), with the plurality of pixels, arranged in the same column, connected to the AD conversion section via a vertical signal line, and a ramp signal generation section adapted to generate a ramp signal, the imaging method including:

a step in which the AD conversion section performs an operation of converting, in parallel with reset operation or signal transfer operation performed by the pixels connected via some of a given number of vertical signal lines, the pixel signals output from the pixels connected via other vertical signal lines from analog to digital form, with these operations being carried out alternately and repeatedly, and a step in which the ramp signal is controlled in such a manner as to be supplied to the AD conversion sections that perform AD conversion of the pixel signals output from the pixels and not supplied to the AD conversion sections that do not perform AD conversion.

(8)

A piece of electronic equipment including:

an imaging element, the imaging element including a pixel area having a plurality of pixels arranged in a matrix form, a column AD signal processing section having, for each pixel column, an AD conversion section for converting pixel signals output from the pixels from analog into digital form (performing AD (Analog to Digital) conversion), with the plurality of pixels, arranged in the same column, connected to the AD conversion section via a vertical signal line, and a ramp signal generation section adapted to generate a ramp signal, in which the AD conversion section performs an operation of converting, in parallel with reset operation or signal transfer operation performed by the pixels connected via some of a given number of vertical signal lines, the pixel signals output from the pixels connected via other vertical signal lines from analog to digital form, with these operations being carried out alternately and repeatedly, and the ramp signal is controlled in such a manner as to be supplied to the AD conversion sections that perform AD conversion of the pixel signals output from the pixels and not supplied to the AD conversion sections that do not perform AD conversion.

REFERENCE SIGNS LIST

11 Imaging element, 12 Pixel area, 13 Vertical drive circuit, 14 Column signal processing circuit, 15 Horizontal drive circuit, 16 Output circuit, 17 Ramp signal generation circuit, 18 Control circuit, 21 Pixel, 22 Horizontal signal line, 23 Vertical signal line, 24 Data output signal line, 31 PD, 32 Transfer transistor, 33 FD section, 34 Amplifying transistor, 35 Selection transistor, 36 Reset transistor, 41 Column processing section, 42 Constant current source, 51 Input switch, 52 Comparator, 53 Counter, 54 Output switch, 55 Holding section

The invention claimed is:

1. An imaging element comprising:
a pixel area having a plurality of pixels arranged in a matrix form, wherein the pixel area includes a plurality of pixel columns, and wherein each of the pixel columns includes a plurality of the pixels;
a column analog to digital (AD) signal processing section having a plurality of AD conversion sections, wherein an AD conversion section for converting pixel signals output from the pixels from analog into digital form is provided for each of the pixel columns, and wherein the pixels in each of the pixel columns are connected to the AD conversion section via one or more vertical signal lines;
a ramp signal generation section adapted to generate a ramp signal; and
a plurality of switches, wherein control of the ramp signal is achieved by controlling opening and closing of each of the switches, and wherein each of the switches is provided inside a comparator included in a respective one of the AD conversion sections,
wherein during a first operation period an AD conversion section included in the plurality of AD conversion sections performs an operation of converting, in parallel with a reset operation or a signal transfer operation performed by the pixels connected via some of a given number of vertical signal lines to another AD conversion section included in the plurality of AD conversion sections, the pixel signals output from the pixels connected via other vertical signal lines from analog to digital form, and
wherein the ramp signal is controlled in such a manner as to be supplied to AD conversion sections that perform AD conversion of the pixel signals output from the pixels and not supplied to AD conversion sections that do not perform AD conversion.

2. The imaging element of claim 1, wherein the switch is provided on a path between the ramp signal generation section and the AD conversion section.

3. The imaging element of claim 1, wherein for each comparator the switch is provided on a current path inside the comparator.

4. The imaging element of claim 1, wherein for each comparator the switch is provided on a current path on one of two sides inside the comparator, the side where a signal from the pixel is processed and the side where a ramp signal from the ramp signal generation section is processed.

5. The imaging element of claim 1, wherein
the ramp signal generation section generates ramp signals individually for reading out a pixel signal of a first pixel at reset level, a pixel signal of a second pixel at reset level, a pixel signal of the first pixel at signal level, and a pixel signal of the second pixel at signal level repeatedly in this order, and
the switch is switched from an open state to a closed state or vice versa when the ramp signals are switched from one to another.

6. An imaging method of an imaging element, the imaging element including:
a pixel area having a plurality of pixels arranged in a matrix form, wherein the pixel area includes a plurality of pixel columns, and wherein each of the pixel columns includes a plurality of the pixels;
a column analog to digital (AD) signal processing section having a plurality of AD conversion sections, wherein an AD conversion section for converting pixel signals output from the pixels from analog into digital form is provided for each of the columns, and wherein the pixels in each of the pixel columns are connected to the respective AD conversion section via one or more vertical signal lines;
a ramp signal generation section adapted to generate a ramp signal; and
a plurality of switches, wherein control of the ramp signal is achieved by controlling opening and closing of each of the switches, and wherein each of the switches is provided inside a comparator included in a respective one of the AD conversion sections, the imaging method comprising:
a step in which an AD conversion section included in the plurality of AD conversion sections performs an operation of converting, in parallel with reset operation or signal transfer operation performed by the pixels connected via some of a given number of vertical signal lines to another AD conversion section included in the plurality of AD conversion sections, the pixel signals output from the pixels connected via other vertical signal lines from analog to digital form, with these operations being carried out alternately and repeatedly, and
a step in which the ramp signal is controlled in such a manner as to be supplied to AD conversion sections that perform AD conversion of the pixel signals output from the pixels and not supplied to AD conversion sections that do not perform AD conversion.

7. A piece of electronic equipment comprising:
an imaging element, the imaging element including:
a pixel area having a plurality of pixels arranged in a matrix form, wherein the pixel area includes a plurality of pixel columns, and wherein each of the pixel columns includes a plurality of the pixels,
a column analog to digital (AD) signal processing section having a plurality of AD conversion sections, wherein an AD conversion section for converting pixel signals output from the pixels from analog into digital form is provided for each of the pixel columns, and wherein the pixels in each of the pixel columns are connected to the AD conversion section via one or more vertical signal lines, and a ramp signal generation section adapted to generate a ramp signal; and a plurality of switches, wherein control of the ramp signal is achieved by controlling opening and closing of each of the switches, and wherein each of the switches is provided inside a comparator included in a respective one of the AD conversion sections, wherein during a first operation period an AD conversion section included in the plurality of AD conversion sections performs an operation of converting, in parallel with a reset operation or a signal transfer operation performed by the pixels connected via some of a given number of vertical signal lines to another AD conversion section included in the plurality of AD conversion sections, the pixel signals output from the pixels connected via other vertical signal lines from analog to digital form, and wherein the ramp signal is controlled in such a manner as to be supplied to AD conversion sections that perform AD conversion of the pixel signals output from the pixels and not supplied to AD conversion sections that do not perform AD conversion.

* * * * *